(12) United States Patent
Lee et al.

(10) Patent No.: US 7,169,670 B2
(45) Date of Patent: Jan. 30, 2007

(54) METHOD OF FORMING GATE OXIDE LAYER IN SEMICONDUCTOR DEVICE

(75) Inventors: Min Kyu Lee, Icheon-Shi (KR); Hee Hyun Chang, Seongnam-Shi (KR); Jum Soo Kim, Icheon-Shi (KR); Jung Ryul Ahn, Namyangiu-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 216 days.

(21) Appl. No.: 10/880,691

(22) Filed: Jun. 30, 2004

(65) Prior Publication Data

US 2005/0048723 A1  Mar. 3, 2005

(30) Foreign Application Priority Data

Aug. 27, 2003  (KR)  .................. 10-2003-0059419

(51) Int. Cl.
*H01L 21/336* (2006.01)
(52) U.S. Cl. ................ 438/258; 438/981; 257/E21.625
(58) Field of Classification Search ................ 438/201, 438/211, 981; 257/E21.625, E21.684, E21.689
See application file for complete search history.

(56) References Cited

U.S. PATENT DOCUMENTS 6,380,020 B1 * 4/2002 Shimizu ..................... 438/225

2002/0119615 A1 * 8/2002 Kim et al. .................. 438/201

* cited by examiner

*Primary Examiner*—Chandra Chaudhari
(74) *Attorney, Agent, or Firm*—Marshall, Gerstein & Borun LLP

(57) ABSTRACT

Provided is related to a method of forming a semiconductor device comprises steps of: providing a semiconductor substrate having a low voltage region and a high voltage region; forming a pad oxide layer and a pad nitride layer in sequence on the semiconductor substrate; removing the pad nitride layer and the pad oxide layer on the semiconductor substrate of the high voltage region, wherein a surface of the semiconductor substrate of the high voltage region is exposed and recessed; forming a sacrificial oxide layer on the surface of the semiconductor substrate of the high voltage region; removing the sacrificial layer; forming a first gate oxide layer on the surface of the semiconductor substrate of the high voltage region; removing the pad oxide layer and the pad nitride layer left on the semiconductor substrate of the low voltage region, wherein a surface of the semiconductor substrate of the low voltage region is exposed and recessed; and forming a second gate oxide layer on the first gate oxide layer and the surface of the semiconductor substrate of the low voltage region.

8 Claims, 2 Drawing Sheets

METHOD OF FORMING GATE OXIDE LAYER IN SEMICONDUCTOR DEVICE

BACKGROUND

1. Field of the Invention

The present invention relates to a method for forming a gate oxide layer of a semiconductor device, and more especially, to a method for forming gate oxide layers formed in a high voltage transistor and a low voltage transistor of a flash memory device, respectively.

2. Discussion of Related Art

The flash memory device is comprised of a cell region with a plurality of cell transistors which store and erase data by tunneling and a peripheral circuit to drive the cell transistor. The peripheral circuit is divided to a low voltage region formed of a low voltage transistor which is applied a low voltage and a high voltage region formed of a high voltage transistor which immunizes against a high voltage for about 20V necessary for tunneling. The high voltage transistor has to comprise of a gate oxide layer as thick as about 300 Å to have immunity against the high voltage.

Therefore, the gate oxide layers for the high voltage transistor are four times as thick as those for the low voltage transistor, of which surfaces have different topologies, thereby transferring the surface topology of the gate oxide layers to a layers which are evaporated later. These topologies make following processes difficult and the device characteristics worse.

Furthermore, there should be made a method to minimize the surface topology between the gate oxide layer for the high voltage transistor and a gate oxide layer for the low voltage transistor.

SUMMARY OF THE INVENTION

The present invention is directed to solve those aforementioned problems, as providing a method for forming a gate oxide layer in a semiconductor device capable of minimizing surface topologies between a gate oxide layer for a high voltage transistor and a gate oxide layer for a low voltage transistor.

One aspect of the present invention is to provide a method of forming a semiconductor device comprises steps of: providing a semiconductor substrate having a low voltage region and a high voltage region; forming a pad oxide layer and a pad nitride layer in sequence on the semiconductor substrate; removing the pad nitride layer and the pad oxide layer on the semiconductor substrate of the high voltage region, wherein a surface of the semiconductor substrate of the high voltage region is exposed and recessed; forming a sacrificial oxide layer on the surface of the semiconductor substrate of the high voltage region; removing the sacrificial layer; forming a first gate oxide layer on the surface of the semiconductor substrate of the high voltage region; removing the pad oxide layer and the pad nitride layer left on the semiconductor substrate of the low voltage region, wherein a surface of the semiconductor substrate of the low voltage region is exposed and recessed; and forming a second gate oxide layer on the first gate oxide layer and the surface of the semiconductor substrate of the low voltage region.

DETAILED DESCRIPTION OF PREFERRED EMBODIMENTS

Figure 1:
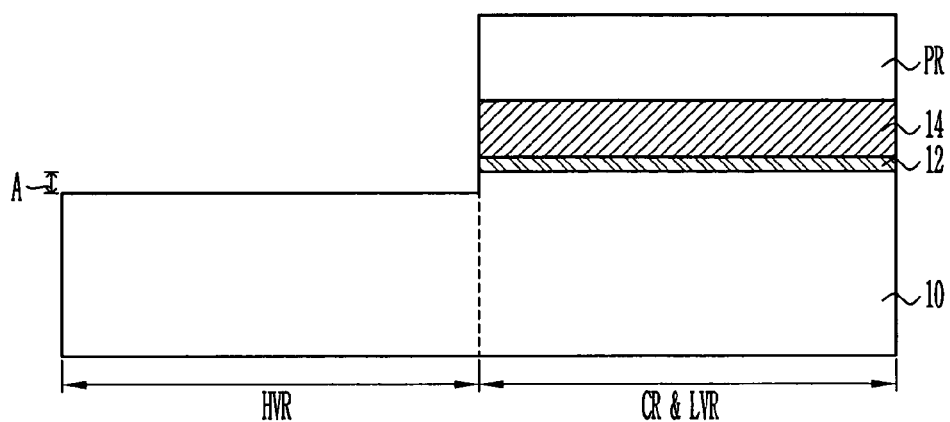
FIGS. 1 through 5 are sectional views illustrating a method of forming a gate oxide layer of a semiconductor device in accordance with the present invention.

Hereinafter, preferred embodiments of the present invention will now be explained in detail with reference to the accompanying drawings. Although preferred embodiments of the present invention may be variable to other illustrative formation, it should not be taken in a limiting sense. The embodiments are provided to illustrate the present invention more successfully to those skilled in the art. Therefore, such as a thickness of a layer may be exaggerated to focus on an obvious explanation and the same reference numerals will be used throughout the drawings and the description to refer to the same or like parts. If there is a reference that a layer is interposed on or contacted to another layer or a surface of a semiconductor substrate, the layer may be directly contacted to another layer or the surface of the semiconductor substrate, or a third layer may be interposed between them.

FIGS. 1 through 5 are sectional views illustrating a method of forming a gate oxide layer of a semiconductor device in accordance with the present invention.

Referring to FIG. 1, on the entire semiconductor substrate 10 is formed of a pad oxide layer 12 and a pad nitride layer 14 in sequence, while the semiconductor substrate 10 is divided to a high voltage region HVR, a low voltage region LVR, and a cell region CR, which regions are formed of adaptable transistors, alternatively. Thereof, a photoresist pattern PR is formed on the top of the pad nitride layer 14. The high voltage region HVR is not covered with the photoresist pattern PR. The pad nitride layer 14 and the pad oxide layer 12 formed on the high voltage region HVR on the semiconductor substrate is removed by performing a wet etching process with the photoresist pattern PR as an etching mask, to open only the surface of the high voltage region HVR of the semiconductor substrate 10. In addition, about 100~500 Å in thickness of the semiconductor substrate 10 is etched and recessed during performing the etching process for exposing the surface of the semiconductor substrate, which operation is led to remove a damage of the semiconductor substrate on the high voltage region HVR made at the etching process, and also to maintain the thickness of the high voltage region HVR to be lower than those of the low voltage region LVR and the cell region CR, or the same to those of the regions.

Figure 2:
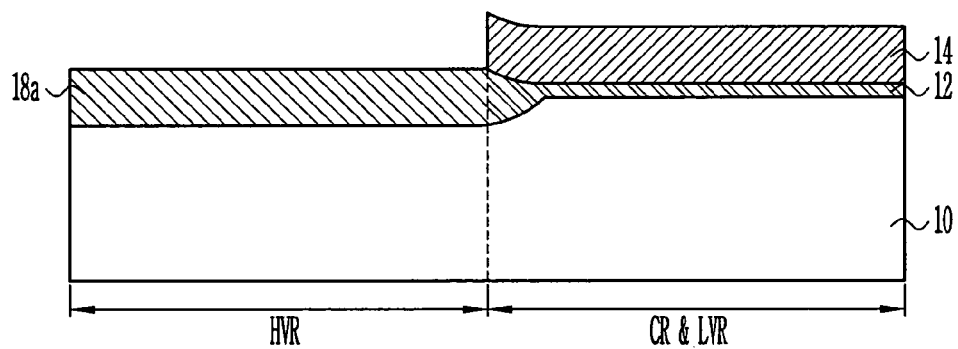

Referring to FIG. 2, a sacrificial layer 18a is formed with an oxide layer on the open region of the high voltage region HVR, after removing the photoresist pattern PR. As the sacrificial layer 18a is formed to compensate for damages on the semiconductor substrate made at the open-etching process in the high voltage region HVR. The sacrificial layer 18a is formed for about 150~1000 Å in thickness through an oxidation process under the temperature of about 850~1100° C.

Figure 3:
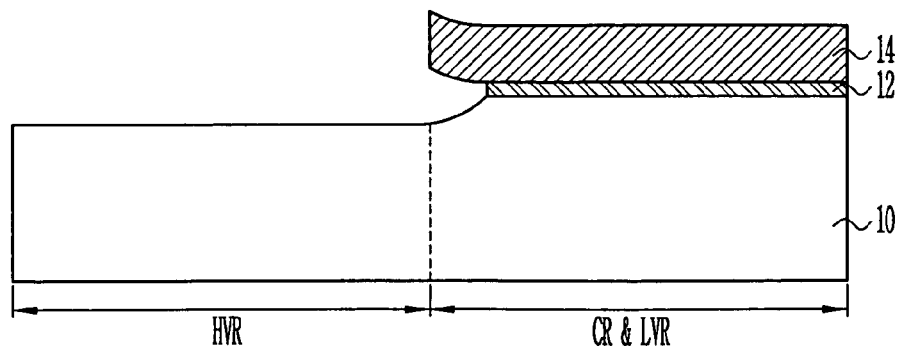

Referring to FIG. 3, the sacrificial layer 18a formed on the high voltage region HVR is removed.

Figure 4:
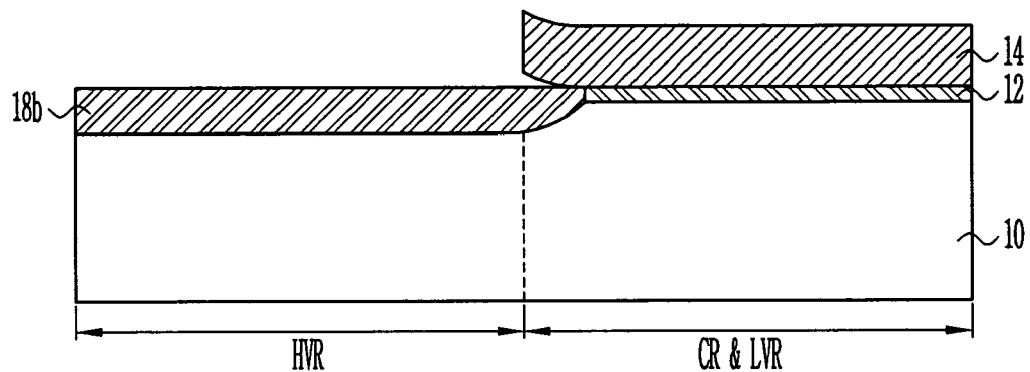

As illustrated in FIG. 4, a first gate oxide layer 18b for a high voltage transistor is formed on the high voltage region HVR where the sacrificial layer is removed. The first gate oxide layer 18b is to be used as a gate oxide layer for the high voltage transistor, forming in reference to the thickness of the pad oxide layer 12 formed on the cell region CR and the low voltage region LVR. The first gate oxide layer 18b is formed for about 150~500 Å in thickness through the oxidation process under the temperature of about 850~1100° C.

Figure 5:
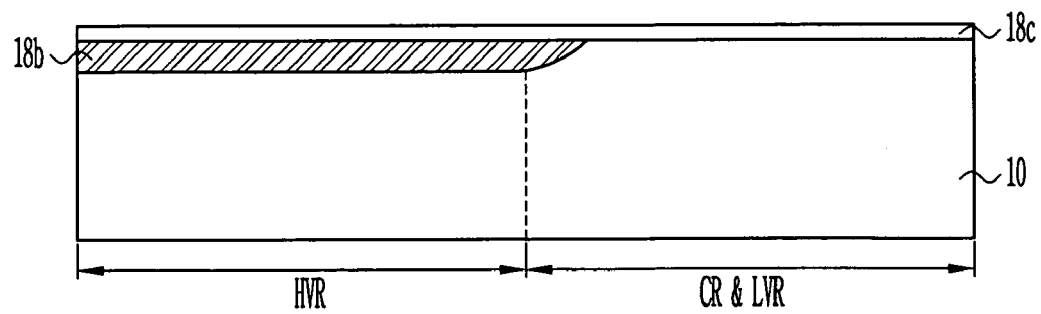

FIG. 5 shows a process for removing both the pad oxide layer 12 and the pad nitride layer 14 formed on the low voltage region LVR and the cell region CR. While this, a predetermined height of the first gate oxide layer 18b formed on the high voltage region HVR is removed during the removing process of the pad oxide layer 12 and the pad nitride layer 14. Accordingly, as comparing the thickness of the semiconductor substrate removed the predetermined height of the first gate oxide layer 18b with the thickness of the semiconductor substrate removed the pad oxide layer and the pad nitride layer on the low voltage region LVR and the cell region CR, the surface topologies between both of them can be minimized. Then, as a second gate oxide layer 18c is formed on the entire result which is done the removing process, gate oxide layers with the planarized the surfaces can be formed among the high voltage region HVR, the low voltage region LVR, and the cell region CR where the surface topologies are minimized.

Furthermore, the first gate oxide layer 18b of which the predetermined depth is etched and the second gate oxide layer 18c become the gate oxide layer for the high voltage transistor in the high voltage region HVR, while only the second gate oxide layer 18c becomes the gate oxide layer for the low voltage transistor in the low voltage region LVR.

By the forming process of double gate oxide layers due to forming the first and second gate oxide layers of the present invention, the damage of the semiconductor substrate is compensated, which results from the etching process of the pad oxide layer and the pad nitride layer on the high voltage region, and the surface topologies generated among the high voltage region, the low voltage region, and the cell region are minimized, thereby planarizing surfaces formed on each of the regions.

As described above, by the operation of forming double gate oxide layers due to forming the first and second gate oxide layers in accordance with the present inventing, the surface topologies generated in the high voltage region, the low voltage region, and the cell region are minimized, which results to be advantageous to planarize the surfaces among gate oxide layers formed on each of the regions.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of forming a semiconductor device comprises steps of:
    providing a semiconductor substrate having a low voltage region and a high voltage region;
    forming a pad oxide layer and a pad nitride layer in sequence on the semiconductor substrate;
    removing the pad nitride layer, the pad oxide layer, and a portion of the semiconductor substrate of the high voltage region so that a surface of the semiconductor substrate of the high voltage region is exposed and recessed;
    forming a sacrificial layer on the recessed portion of the semiconductor substrate of the high voltage region;
    removing the sacrificial layer;
    forming a first gate oxide layer on the surface of the semiconductor substrate of the high voltage region;
    removing the pad oxide layer and the pad nitride layer left on the semiconductor substrate of the low voltage region, wherein a surface of the semiconductor substrate of the low voltage region is exposed and recessed; and
    forming a second gate oxide layer on the first gate oxide layer and the surface of the semiconductor substrate of the low voltage region.

2. The method of forming a semiconductor device of claim 1, further comprising the steps of: forming a photoresist pattern on the pad nitride layer on the semiconductor substrate of the low voltage region; and removing the photoresist pattern after removing the pad nitride layer and the pad oxide layer on the semiconductor substrate of the high voltage region.

3. The method of forming a semiconductor device of claim 2, wherein the step of removing the pad nitride layer and the pad oxide layer on the semiconductor substrate of the high voltage region includes the step of performing a wet etching process with the photoresist pattern as an etch mask.

4. The method of forming a semiconductor device of claim 1, the sacrificial layer is formed with an oxide layer.

5. The method of forming a semiconductor device of claim 4, the sacrificial layer is formed to a thickness of about 150~1000 Å.

6. The method of forming a semiconductor device of claim 1, the first gate oxide layer is formed to a thickness of about 150~500 Å.

7. The method of forming a semiconductor device of claim 1, the first gate oxide layer as well as the second gate oxide layer become a gate oxide layer for a high voltage transistor which is formed on the high voltage region.

8. The method of forming a semiconductor device of claim 7, the second gate oxide layer become a gate oxide layer for a low voltage transistor which is formed on the low voltage region.

* * * * *